(12) United States Patent
Mohammed et al.

(10) Patent No.: US 8,816,383 B2
(45) Date of Patent: Aug. 26, 2014

(54) HIGH PERFORMANCE LIGHT EMITTING DIODE WITH VIAS

(71) Applicant: Invensas Corporation, San Jose, CA (US)

(72) Inventors: Ilyas Mohammed, Santa Clara, CA (US); Liang Wang, Milpitas, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/732,275

(22) Filed: Dec. 31, 2012

(65) Prior Publication Data

US 2014/0014894 A1 Jan. 16, 2014

Related U.S. Application Data

(63) Continuation-in-part of application No. 13/543,697, filed on Jul. 6, 2012, now Pat. No. 8,664,681.

(51) Int. Cl.
| | | |
|---|---|---|
| *H01L 29/22* | (2006.01) | |
| *H01L 33/00* | (2010.01) | |
| *H01L 27/15* | (2006.01) | |
| *H01L 29/227* | (2006.01) | |
| *H01L 33/38* | (2010.01) | |
| H01L 33/60 | (2010.01) | |
| H01L 33/62 | (2010.01) | |
| H01L 33/06 | (2010.01) | |
| H01L 33/42 | (2010.01) | |

(52) U.S. Cl.
CPC ............... *H01L 33/382* (2013.01); *H01L 33/60* (2013.01); *H01L 2924/0002* (2013.01); *H01L 33/62* (2013.01); *H01L 2933/0066* (2013.01); *H01L 33/06* (2013.01); *H01L 33/42* (2013.01)

USPC .................... 257/99; 257/81; 257/95; 257/98; 257/E33.056; 257/E33.058

(58) Field of Classification Search
CPC ............ H01L 23/481; H01L 23/49827; H01L 23/5384
USPC ........... 257/81, 95, 98, 99, E33.056, E33.058
See application file for complete search history.

(56) References Cited

U.S. PATENT DOCUMENTS 7,095,108 B2 * 8/2006 Palanduz ...................... 257/700
7,462,879 B2 * 12/2008 Oohata et al. .................... 257/99
(Continued)

FOREIGN PATENT DOCUMENTS

| DE | 10016714 A1 | 10/2001 |
| WO | 2012039555 A2 | 3/2012 |
| WO | 2012091042 A1 | 7/2012 |

OTHER PUBLICATIONS

PCT International Search Report and Written Opinion dated Aug. 29, 2013; International Application No. PCT/US2013/049374; ISA/EPO.

(Continued)

*Primary Examiner* — Ida M Soward

(57) ABSTRACT

High performance light emitting diode with vias. In accordance with a first embodiment of the present invention, an article of manufacture includes a light emitting diode. The light emitting diode includes a plurality of filled vias configured to connect a doped region on one side of the light emitting diode to a plurality of contacts on the other side of the light emitting diode. The filled vias may comprise less that 10% of a surface area of the light emitting diode.

20 Claims, 26 Drawing Sheets

(56) References Cited

U.S. PATENT DOCUMENTS

| | | | |
|---|---|---|---|
| 8,361,819 B2* | 1/2013 | Kim | 438/29 |
| 8,431,422 B2* | 4/2013 | Herrmann | 438/23 |
| 8,552,441 B2* | 10/2013 | Wu et al. | 257/94 |
| 8,642,363 B2* | 2/2014 | Lau et al. | 438/28 |
| 2004/0125832 A1* | 7/2004 | Mahnkopf et al. | 372/20 |
| 2006/0166391 A1* | 7/2006 | Nemoto | 438/35 |
| 2006/0285567 A1* | 12/2006 | Otoma | 372/50.1 |
| 2008/0211416 A1* | 9/2008 | Negley et al. | 315/193 |
| 2009/0278139 A1 | 11/2009 | Fjelstad | |
| 2010/0019387 A1* | 1/2010 | Miura | 257/773 |
| 2010/0032808 A1* | 2/2010 | Ding et al. | 257/621 |
| 2010/0038655 A1 | 2/2010 | Chen et al. | |
| 2010/0133678 A1* | 6/2010 | Saiki et al. | 257/686 |
| 2011/0012164 A1 | 1/2011 | Kim | |
| 2011/0068359 A1 | 3/2011 | Yahata et al. | |
| 2011/0155997 A1* | 6/2011 | Lee et al. | 257/13 |
| 2011/0275173 A1* | 11/2011 | Khaja et al. | 438/34 |
| 2012/0086026 A1* | 4/2012 | Engl et al. | 257/93 |
| 2012/0140489 A1* | 6/2012 | Chung et al. | 362/368 |
| 2012/0175732 A1* | 7/2012 | Lin et al. | 257/531 |
| 2012/0228524 A1* | 9/2012 | Matui et al. | 250/494.1 |
| 2013/0026525 A1* | 1/2013 | Chen et al. | 257/98 |
| 2013/0026529 A1* | 1/2013 | Tsang | 257/99 |
| 2013/0114032 A1* | 5/2013 | Chen et al. | 349/141 |
| 2013/0200528 A1* | 8/2013 | Lin et al. | 257/774 |
| 2013/0207154 A1* | 8/2013 | Hoppel | 257/99 |
| 2013/0277696 A1 | 10/2013 | Matsui et al. | |
| 2013/0313640 A1* | 11/2013 | Shen et al. | 257/336 |
| 2014/0084244 A1* | 3/2014 | Yu et al. | 257/13 |

OTHER PUBLICATIONS

PCT International Search Report and Written Opinion dated Feb. 11, 2014; International Application No. PCT/US2013/073849; ISA/EPO.

Shanks, H., et al.; Thermal Conductivity of Silicon From 300 to 1400° K; Physical Review; vol. 130, No. 5; Jun. 1, 1963; pp. 1743-1748; XP055099700.

* cited by examiner

HIGH PERFORMANCE LIGHT EMITTING DIODE WITH VIAS

RELATED APPLICATION

This application is a Continuation-in-Part of co-pending, commonly-owned U.S. patent application Ser. No. 13/543,697, filed Jul. 6, 2012, entitled "Parallel Plate Slot Emission Array" to Mohammed et al., which is hereby incorporated herein by reference in its entirety.

FIELD OF INVENTION

Embodiments of the present invention relate to the field of integrated circuit design and manufacture. More specifically, embodiments of the present invention relate to systems and methods for high performance light emitting diodes with vias.

BACKGROUND

Light emitting diodes (LEDs) are gaining wide acceptance in a variety of area-illumination applications, for example, architectural lighting, residential illumination, industrial lighting, outdoor lighting, theatrical lighting and the like.

Conventional light emitting diodes typically have electrical contacts facing in the same direction, e.g., away from a substrate. Some types of LEDs may have electrical contacts at two different levels, e.g., in a "stair step" arrangement. However, the electrical contacts are still typically facing in the same direction.

Unfortunately, such contacts and associated structures tend to block some light output from an LED. In addition, such contact structures present a rather poor path for conducting thermal heat away from an LED. Further, convention contact structures generally result in an uneven electrical field distribution within the LED, leading to a further decrease in power efficiency and light output.

SUMMARY OF THE INVENTION

Therefore, what is needed are systems and methods for high performance light emitting diodes with vias. What is additionally needed are systems and methods for high performance light emitting diodes with vias that enable wafer level packaging, improved thermal conduction and electrical field distribution, and further enable electrical contacts on opposite sides. A further need exists for systems and methods for high performance light emitting diodes with vias that are compatible and complementary with existing systems and methods of integrated circuit design, manufacturing and test. Embodiments of the present invention provide these advantages.

In accordance with a first embodiment of the present invention, an article of manufacture includes a light emitting diode. The light emitting diode includes a plurality of filled vias configured to connect a doped region on one side of the light emitting diode to a plurality of contacts on the other side of the light emitting diode. The filled vias may comprise less that 10% of a surface area of the light emitting diode.

In accordance with another embodiment of the present invention, a light emitting diode apparatus includes an n-doped semiconductor region, a multiple quantum well (MQW) region disposed on said n-doped semiconductor region and a p-doped semiconductor region disposed on said MQW region. The apparatus also includes a plurality of filled vias through said p-doped semiconductor region and through said MQW region, contacting said n-doped semiconductor region. Both terminals of said light emitting diode apparatus are on the same side of said light emitting diode apparatus as said p-doped semiconductor region.

In accordance with yet another embodiment of the present invention, an apparatus includes a light emitting diode. The light emitting diode includes an n-doped semiconductor region, a multiple quantum well (MQW) region disposed on said n-doped semiconductor region and a p-doped semiconductor region disposed on said MQW region. In addition, the apparatus includes a plurality of filled vias through said p-doped semiconductor region and through said MQW region, contacting said n-doped semiconductor region and a carrier substrate. The apparatus further includes a conductive pattern supported by said carrier substrate and metal for electrically coupling said plurality of filled vias to said conductive pattern. The carrier substrate may be configured to couple thermal energy away from said light emitting diode.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Figure 1A:
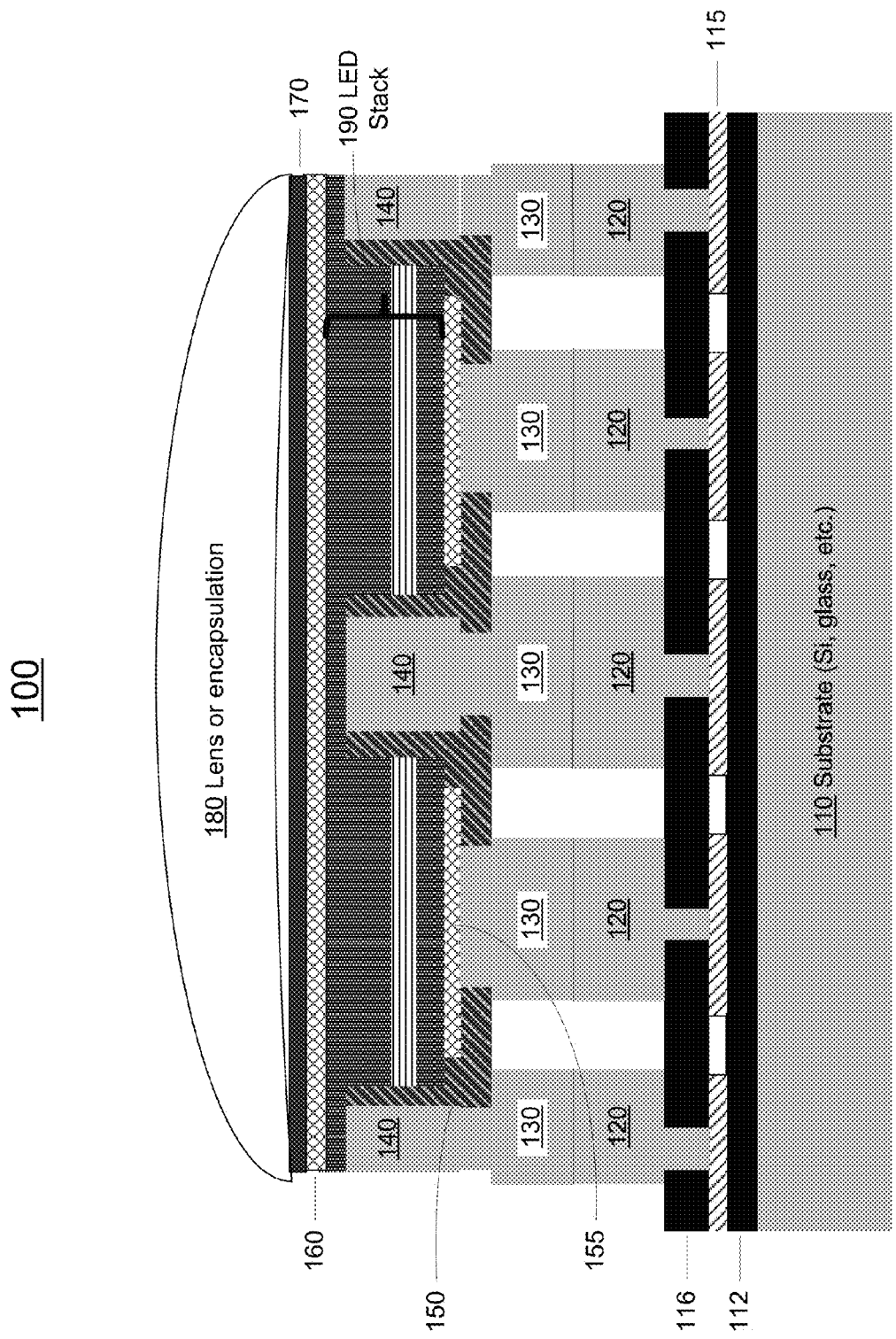
FIG. 1A illustrates a high performance light emitting diode (LED) with vias, in accordance with embodiments of the present invention.

Reference will now be made in detail to various embodiments of the invention, High Performance Light Emitting Diode with Vias, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow (e.g., process 200, 300, 330, 340, 350, 400) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "depositing" or "processing" or "sputtering" or "coating" or "placing" or "slicing" or "forming" or "mounting" or "applying" or "roughening" or "filling" or "accessing" or "performing" or "generating" or "adjusting" or "creating" or "executing" or "continuing" or "indexing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, and by those of ordinary skill in the art, the term "via" may be used to describe or refer to a hole or a filled hole, generally used to electrically couple circuit elements at different levels of a multi-level structure. In accordance with embodiments of the present invention, vias may also have a "trench" structure, e.g., a hole or filled hole in which the length is much greater than the width. In general, herein, vias may be illustrated as generally circular in vertical cross section. However, it is to be understood that vias and/or filled vias may have any suitable shape.

High Performance Light Emitting Diode with Vias

FIG. 1A illustrates a high performance light emitting diode (LED) with vias 100, in accordance with embodiments of the present invention. Light emitting diode 100 comprises a substrate 110. The substrate 110 may comprise any suitable material, including silicon, glass, metals or alloys, ceramics, and the like. As will be further described later, substrate 110 may not utilized in the formation of semiconducting materials, and may be chosen, e.g., for reasons of mechanical strength, thermal properties, electrical properties, and the like.

Disposed on top of the substrate 110 are two layers of insulation 112 and 116. Insulation 112 and 116 may comprise, for example, silicon dioxide ($SiO_2$), silicon nitride ($Si_3N_4$), benzo-cyclo-butene (BCB), spin-on glass, and the like. In between layers 112 and 116 is a layer of patterned metal 115. Patterned metal 115 routes electrical signals for the LED, as will be described further below. Patterned metal 115 may comprise, for example, aluminum (Al), copper (Cu), nickel (Ni), gold (Au) and the like.

Light emitting diode 100 additionally comprises lower metal 120. Lower metal 120 contacts conductive portions of paternal metal 115. Lower metal 120 may comprise copper (Cu), nickel (Ni), gold (Au), tin (Sn) and the like. The material chosen should be selected to effective bonding to upper metal 130. Upper metal 130 is bonded to lower metal 120. Upper metal 130 may comprise copper (Cu), nickel (Ni), gold (Au), tin (Sn) and the like. The material chosen should be selected to effective bonding to lower metal 120. Upper metal 130 is in electrical contact with contact 155 and or via 140.

Filled vias 140 provides an electrical path from patterned metal 115, through some instances of lower metal 120 and upper metal 130, to the n-type semiconducting material, e.g., n-gallium nitride (n-GaN), of the light emitting diode proper. Filled vias 140 may form an array of separated pillars, in some embodiments. Filled vias 140 may from long trenches (in a direction parallel to the MQW plan), in some embodiments. Filled vias 140 may from an enclosed loop of thin side walls wrapping around the device, in some embodiments. In addition, filled vias 140 may directly contact optional layer 170 of a transparent conductive material, further described below. Filled vias 140 may comprise, for example, chrome/gold (Cr/Au), titanium/gold, titanium/aluminum/nickel/gold (Ti/Al/Ni/Au) stacks, and the like.

In accordance with embodiments of the present invention, vias 140 may also be described as a "trench" structure, e.g., a filled hole in which the length, e.g., perpendicular to the plane of FIG. 1A, of vias 140 is much greater than their width. In general, herein, vias may be illustrated as generally circular in vertical cross section. However, it is to be understood that vias and/or filled vias may have any suitable shape.

Contact 155 provides electrical contact from some instances of upper metal 130 to the p-type semiconducting material, e.g., p-gallium nitride (p-GaN), of the light emitting diode proper. Contact 155 may comprise, for example, chrome/gold (Cr/Au), nickel/gold (Ni/Au), nickel palladium/gold (Ni/Pd/Au) stacks, and the like.

Light emitting diode 100 further comprises insulating structures 150. Insulating structure 150 insulate the p-type semiconducting material from filled vias 140 and from some upper metal 130.

Light emitting diode 100 comprises a stack of active materials 190 that emits light. For example, stack 190 may comprise a p-type semiconducting material, e.g., p-gallium nitride (p-GaN), multiple quantum wells (MQW) and n-type semiconducting material, e.g., n-gallium nitride (n-GaN). The top surface 160, e.g., n-GaN, of the active stack 190 may be roughened in order to improve light extraction, in accordance with embodiments of the present invention.

Figure 1B:
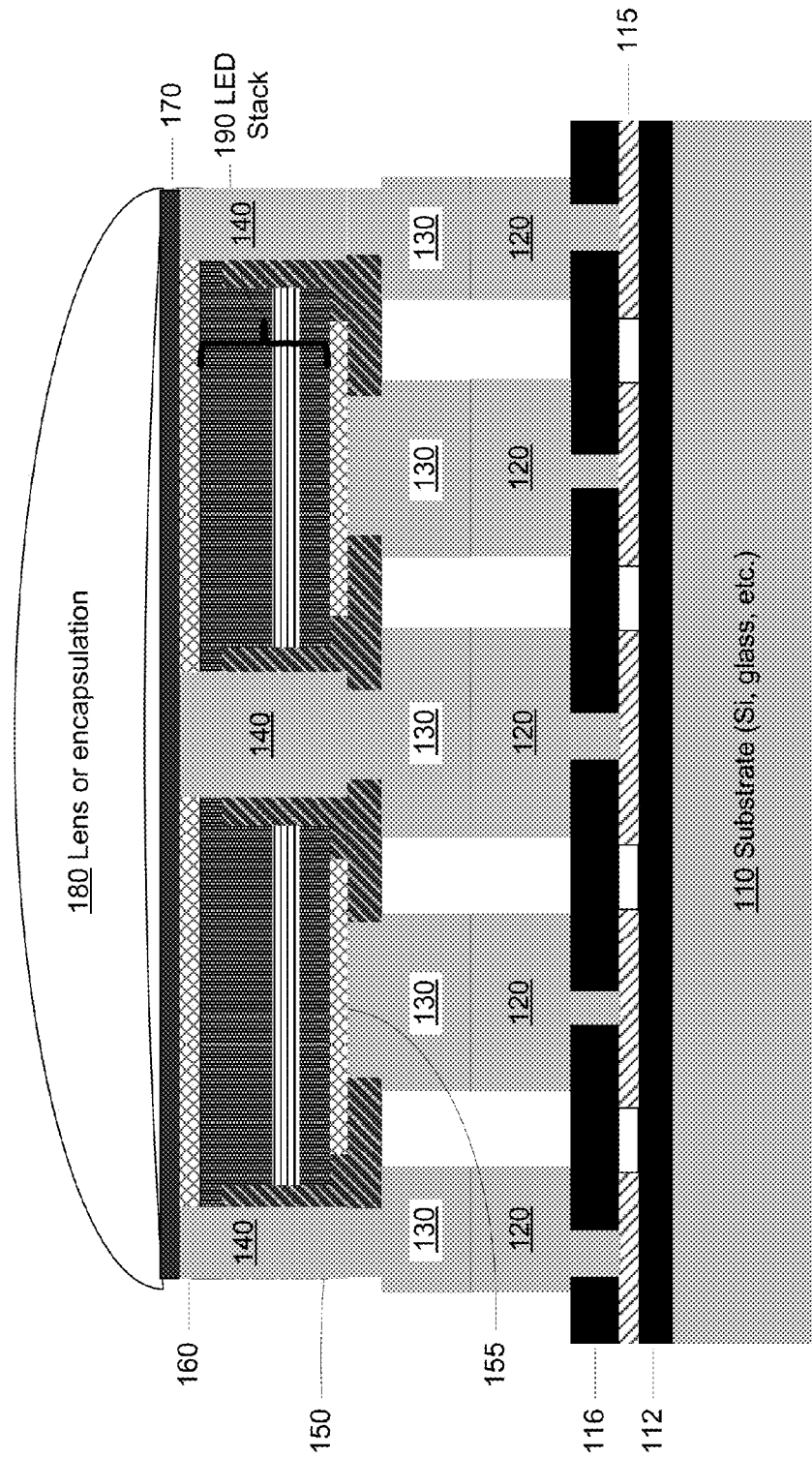
FIG. 1B illustrates a high performance light emitting diode (LED) with vias 101, in accordance with additional embodiments of the present invention.
Figure 1C:
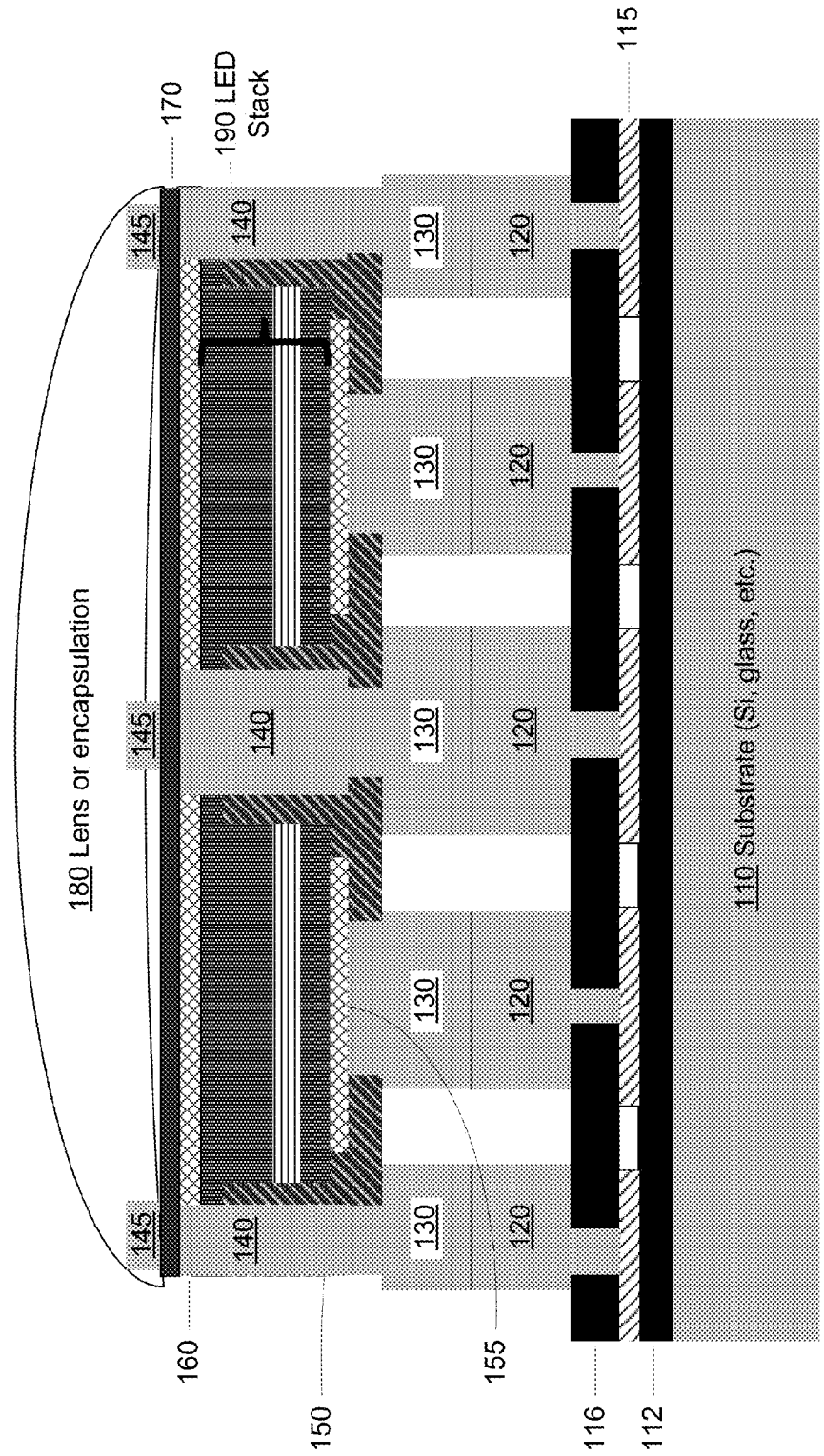
FIG. 1C illustrates a high performance light emitting diode (LED) with vias 102, in accordance with further embodiments of the present invention.

Light emitting diode 100 comprise an optional layer 170 of a transparent conductive material, e.g., indium tin oxide (ITO), supported by a metal grid 145 (FIG. 1C). Optional layer 170 may enhance current spreading. Light emitting diode 100 may further optionally comprise a layer 180 forming a lens or encapsulant. Layer 180 may be transparent, and may be designed to optically enhance light emission and/or directionality, of light emitting diode 100. Layer 180 may also comprise a phosphor layer, e.g., for producing light responsive to receiving light energy from a light emitting diode.

FIG. 1B illustrates a high performance light emitting diode (LED) with vias 101, in accordance with embodiments of the present invention. In the embodiment of FIG. 1B, the filled vias 140 are extended to contact layer 170 of a transparent conductive material.

FIG. 1C illustrates a high performance light emitting diode (LED) with vias 102, in accordance with embodiments of the present invention. In the embodiment of FIG. 1C, the layer 170 of a transparent conductive material is supported by a metal grid 145. Metal grid 145 may comprise any suitable materials, including the exemplary materials previously describe for filled vias 140. In addition, silver is a good choice for metal grid 145, due to its excellent conductivity and semi-transparency at small thickness, e.g. less than about 20 nm.

FIGS. 2A through 2G illustrate an exemplary process 200 for forming a light emitting diode sub-assembly 201, in accordance with embodiments of the present invention. Processes for formation of a carrier wafer sub-assembly and joining of the light emitting diode sub-assembly 201 with the carrier wafer sub-assembly will be further described below.

Figure 2A:
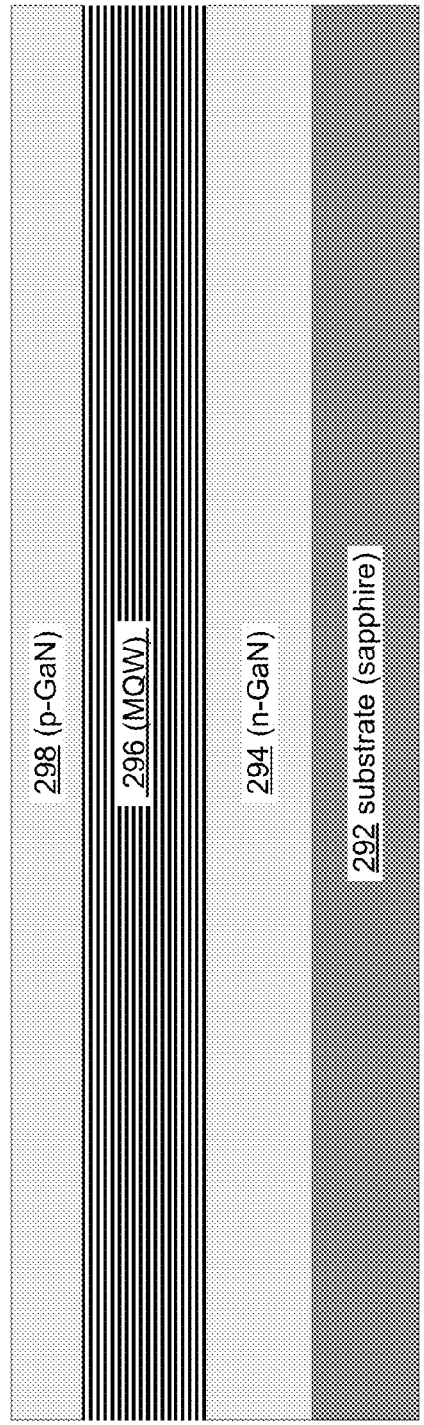
FIGS. 2A, 2B, 2C, 2D, 2E, 2F and 2G illustrate an exemplary process for forming a light emitting diode sub-assembly, in accordance with embodiments of the present invention.

As illustrated in FIG. 2A, a gallium nitride (GaN) multiple quantum well (MQW) light emitting diode is formed on a sapphire ($\alpha$-$Al_2O_3$) substrate 292, in accordance with embodiments of the present invention. The illustrated formation may be via any suitable process and materials. For example, an n-type layer 294, e.g., comprising n doped gallium nitride (n-GaN), is formed on substrate 292. Substrate 292 may comprise a crystalline material that is lattice-matched for gallium nitride, e.g., sapphire ($\alpha$-$Al_2O_3$) or silicon carbide (SiC). A five-period multiple quantum well structure 296 comprising, for example, periods of a 2.5 nm thick 85% gallium, 15% indium nitride layer alternating with a 11 nm thick GaN layer is formed on n-type layer 294. A p-type layer 298, e.g., comprising p-doped gallium nitride (p-GaN) is formed on top of the MQW 296. As is typical, the diode structure is formed continuously over substantially all of the substrate, although this is not required. It is to be appreciated that embodiments in accordance with the present invention are well suited to other types of light emitting diodes comprising different materials.

Figure 2B:
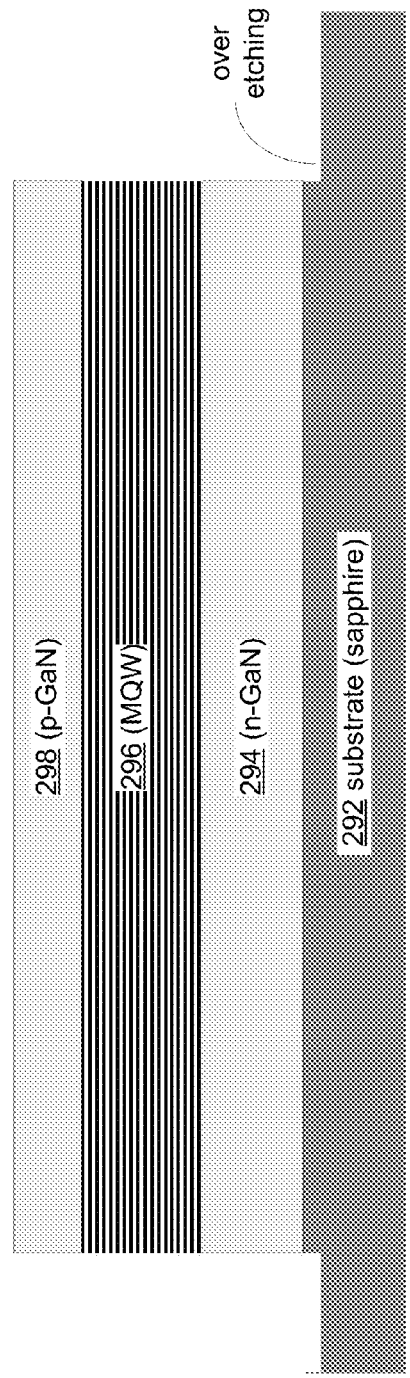

FIG. 2B illustrates defining an area for continued processing of light emitting devices on substrate 292, in accordance with embodiments of the present invention. The illustrated defining may be via any suitable process and materials. For example, a portion of the semiconducting stack is etched away via inductively coupled plasma reactive ion etching (RIE), or other suitable process, defining a perimeter and forming an area of a light emitting diode material. The LED stack may be about 5.215 μm thick, in an embodiment. The etching should be deeper than the stack, e.g., about 6 μm, to ensure complete removal of the semiconducting materials and exposure of the substrate. Any photoresist should be removed, as well.

Figure 2C:
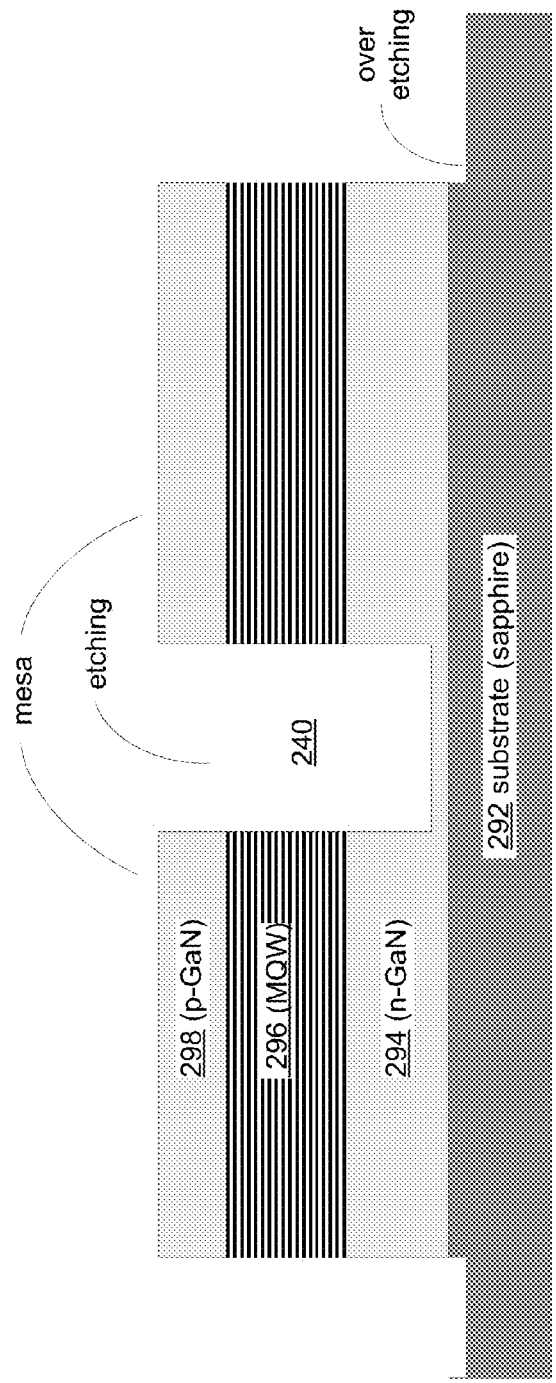

FIG. 2C illustrates opening of vias 240, through p-layer 298 and MQW layer 296, to the n-type layer 294, in accordance with embodiments of the present invention. The illustrated opening may be via any suitable process and materials.

For example, a plurality of via 240 is formed via inductively coupled plasma reactive ion etching (RIE), or other suitable process. The etching to open the vias should be to a lesser depth than the previous etching. For example, the etching of vias 240 should terminate in n-type layer 294, and should not remove all of n-type layer 294. It is appreciated that more than the illustrated one via 240 may be formed in this manner. The vias may be on about 10 μm to about 200 μm centers, with a diameter of about 10 μm to about 200 μm, for example. It is appreciated that vias 240 are well suited to non-circular cross-section(s), in accordance embodiments of the present invention.

Figure 2D:
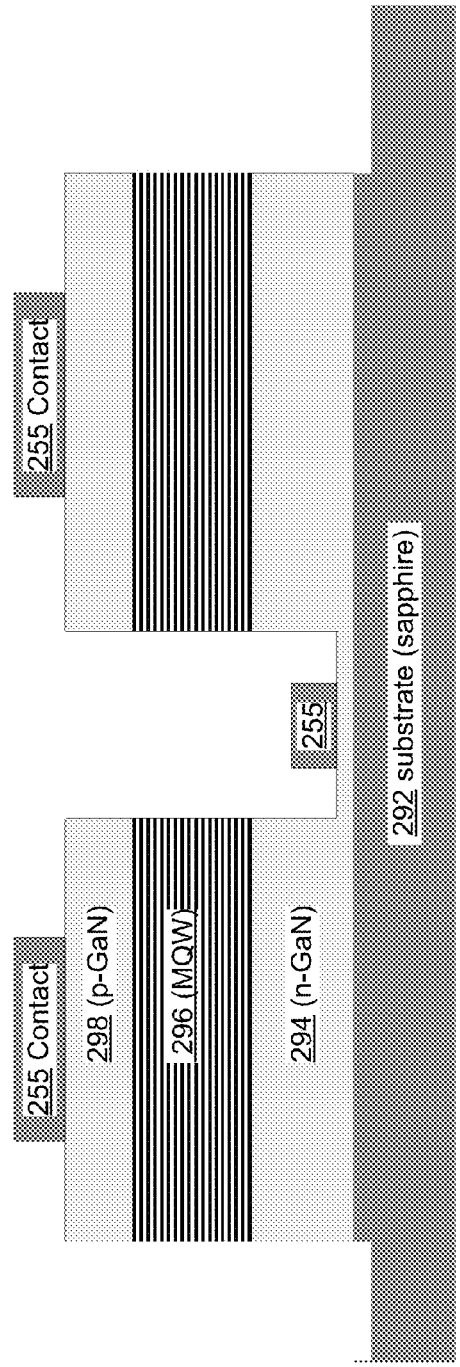

FIG. 2D illustrates formation of metal contacts 255 to p-type layer 298 and n-type layer 294 regions of the LED mesas, in accordance with embodiments of the present invention. The illustrated formation may be via any suitable process and materials. For example, a negative tone mask of photoresist, e.g., of at least 10 μm in thickness, may be used to form a stack of 100 nm of chromium (Cr) and 300 nm of gold (Au), e.g., via sputtering or electron beam ("e-beam") deposition. Any photoresist should be subsequently removed, as well. Then the deposition may be followed by annealing in an oxygen ($O_2$) atmosphere at about 550° C. for about five minutes.

Figure 2E:
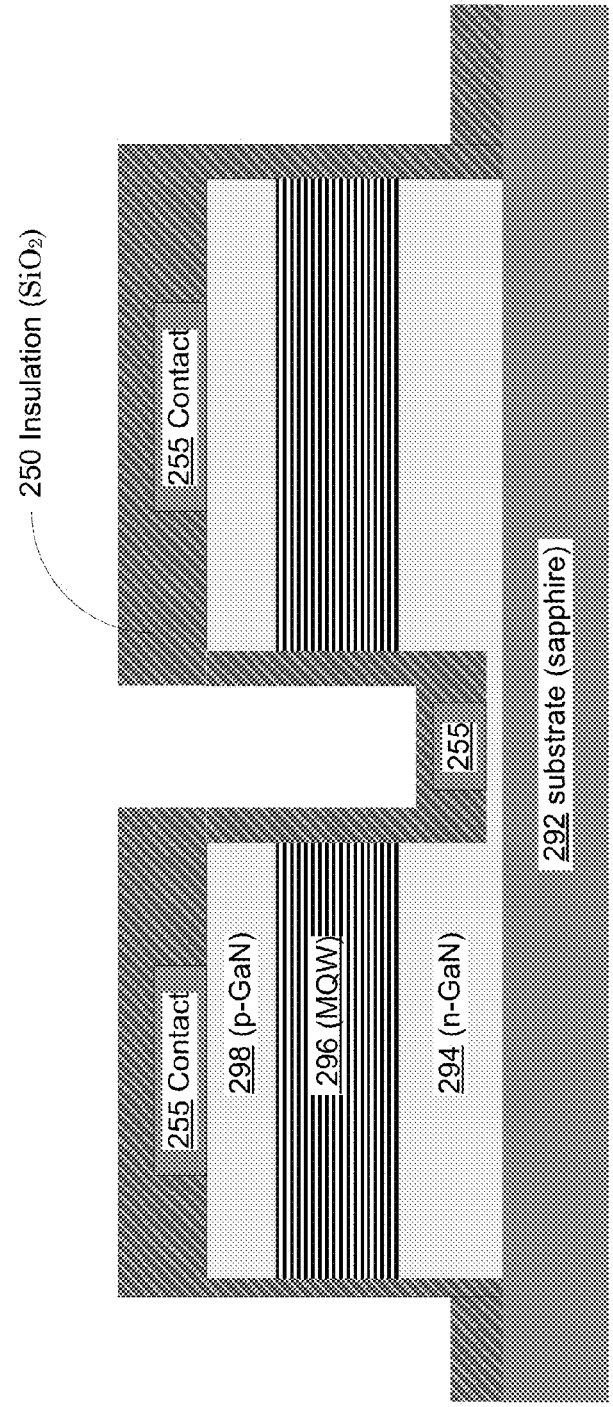

FIG. 2E illustrates deposition of an insulator 250 over all exposed surfaces, in accordance with embodiments of the present invention. It is appreciated that contacts 255 are covered, as well. The illustrated deposition may be via any suitable process and materials. For example, 500 nm of silicon dioxide ($SiO_2$) may be deposited by Plasma-enhanced chemical vapor deposition (PECVD) or low pressure chemical vapor deposition (LPCVD).

Figure 2F:
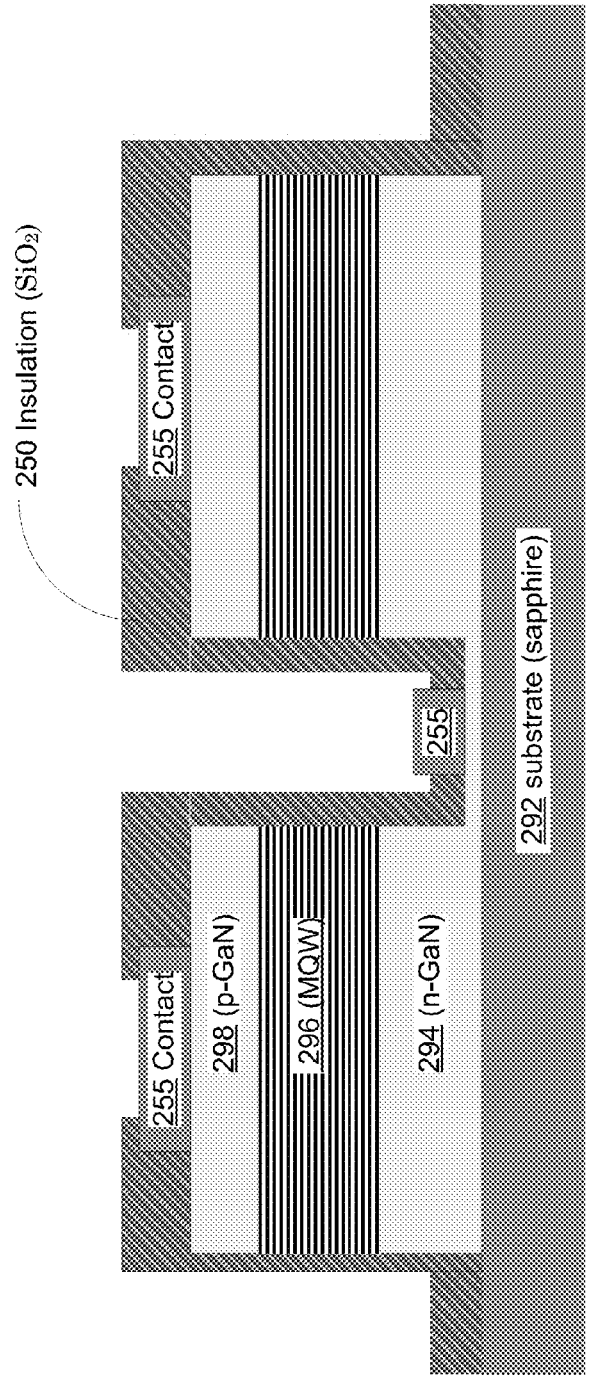

FIG. 2F illustrates opening or uncovering of the contacts 255, in accordance with embodiments of the present invention. The illustrated removal of material may be via any suitable process and materials. For example, photolithographic, wet and/or dry etching processes may be used to selectively etch the insulator 250 from the top surfaces of contacts 255.

Figure 2G:
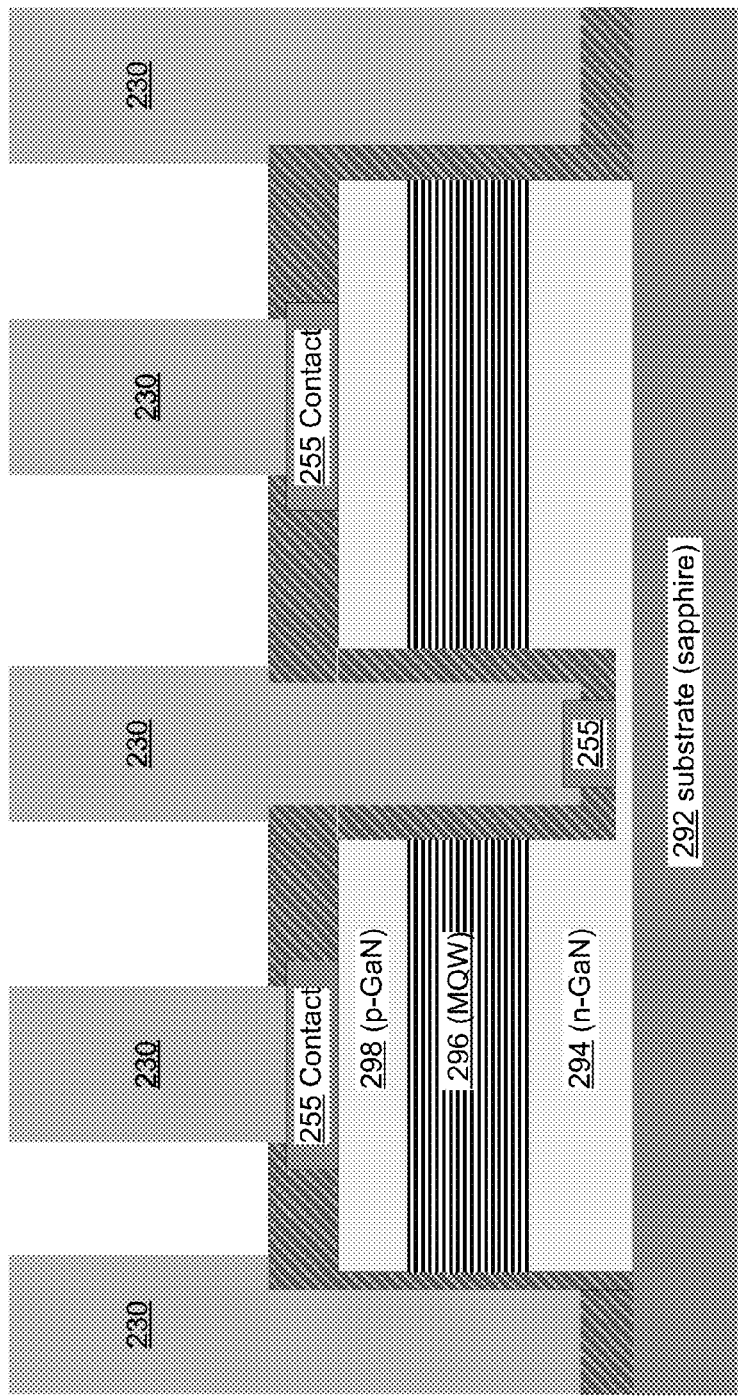

FIG. 2G illustrates formation of upper metal bonding pads 230, in accordance with embodiments of the present invention. The illustrated forming may be via any suitable process and materials. For example, a seed layer of about 100 nm of nickel (Ni) is deposited. It is appreciated that a mask is not required. Next, spin coating may be used to apply a negative tone mask of photoresist, e.g., of at least 10 μm in thickness. Photolithography is used to define the bonding pads. The upper metal bonding pads 230, comprising, for example, 2.75 μm of copper (Cu), 100 nm of nickel (Ni) and 255 nm of gold (Au), may be electroplated. The seed layer may be subsequently etched off by dipping in nitric acid ($HNO_3$). Accordingly, a first sub-assembly 201 is formed.

FIGS. 3A through 3E illustrate an exemplary process 300 for forming a carrier wafer sub-assembly 301, in accordance with embodiments of the present invention. Exemplary processes for joining of the light emitting diode sub-assembly 201 with the carrier wafer sub-assembly 301 will be further described below.

Figure 3A:
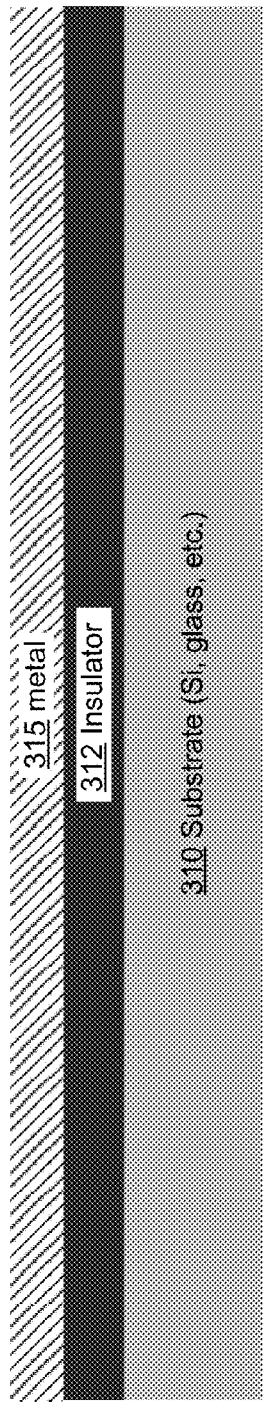
FIGS. 3A, 3B, 3C, 3D and 3E illustrate an exemplary process for forming a carrier wafer sub-assembly, in accordance with embodiments of the present invention.

As illustrated in FIG. 3A, a metal layer 315 is deposited on an insulated substrate, in accordance with embodiments of the present invention. The illustrated deposition may be via any suitable process and materials. The insulated substrate may comprise, for example, a stack of silicon (Si) 310 and an insulator 312, e.g., silicon dioxide ($SiO_2$). The silicon dioxide may be thermally grown, in some embodiments. The stack of materials may also comprise ceramic, glass, tungsten, molybdenum, invar, aluminum, nickel, steel, brass and/or copper in some embodiments. The substrate should have a high thermal conductivity. For example, the substrate thermal conductivity should be greater than about 10 W/mK. The substrate 310 may be greater than about 100 µm thick and insulator 312 may be about 500 nm thick, in some embodiments. A conducting layer 315, e.g., about 1 µm thick, is deposited on top of the insulating layer 312. Layer 315 should be suitable for patterning, and may comprise, for example, aluminum (Al), copper (Cu), nickel (Ni), gold (Au) and the like.

Figure 3B:
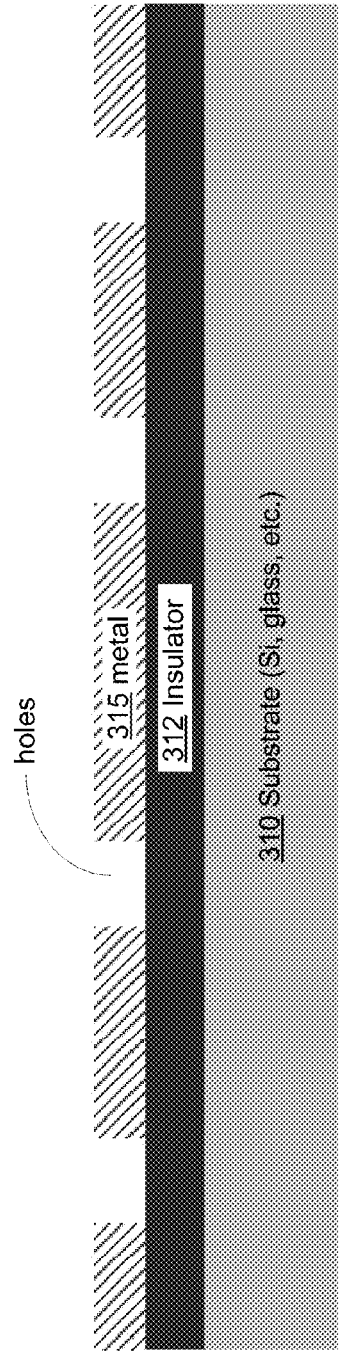

As illustrated in FIG. 3B, portions of metal layer 315 are etched to form a circuit pattern, in accordance with embodiments of the present invention. The illustrated etching may be via any suitable process and materials, including, for example, photolithographic processes.

Figure 3C:
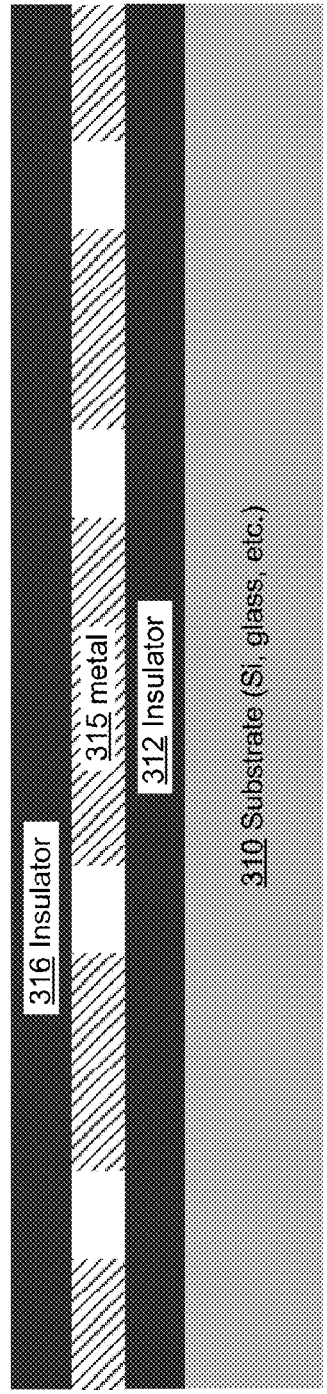

FIG. 3C illustrates deposition of an insulating layer 316 onto the top surface of patterned metal layer 315, in accordance with embodiments of the present invention. The illustrated deposition may be via any suitable process and materials. For example, insulating layer 316 may comprise silicon dioxide ($SiO_2$), silicon nitride ($Si_3N_4$), benzo-cyclo-butene (BCB), spin-on glass, ceramic tungsten and the like. Insulating layer 316 may be about 500 nm thick, in some embodiments.

Figure 3D:
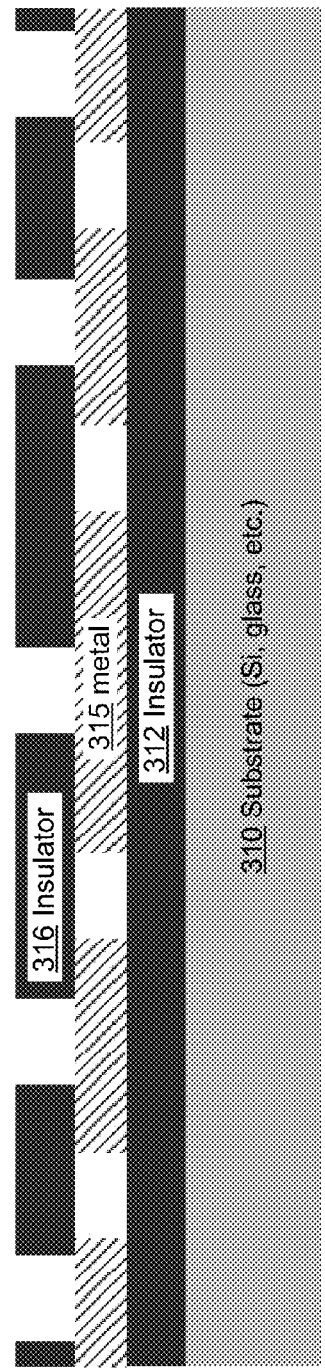

As illustrated in FIG. 3D, vias are opened in insulating layer 316, in accordance with embodiments of the present invention. The illustrated opening may be via any suitable process and materials. For example, after photolithography masking, the insulating material may be selectively etched using wet and/or dry etching.

Figure 3E:
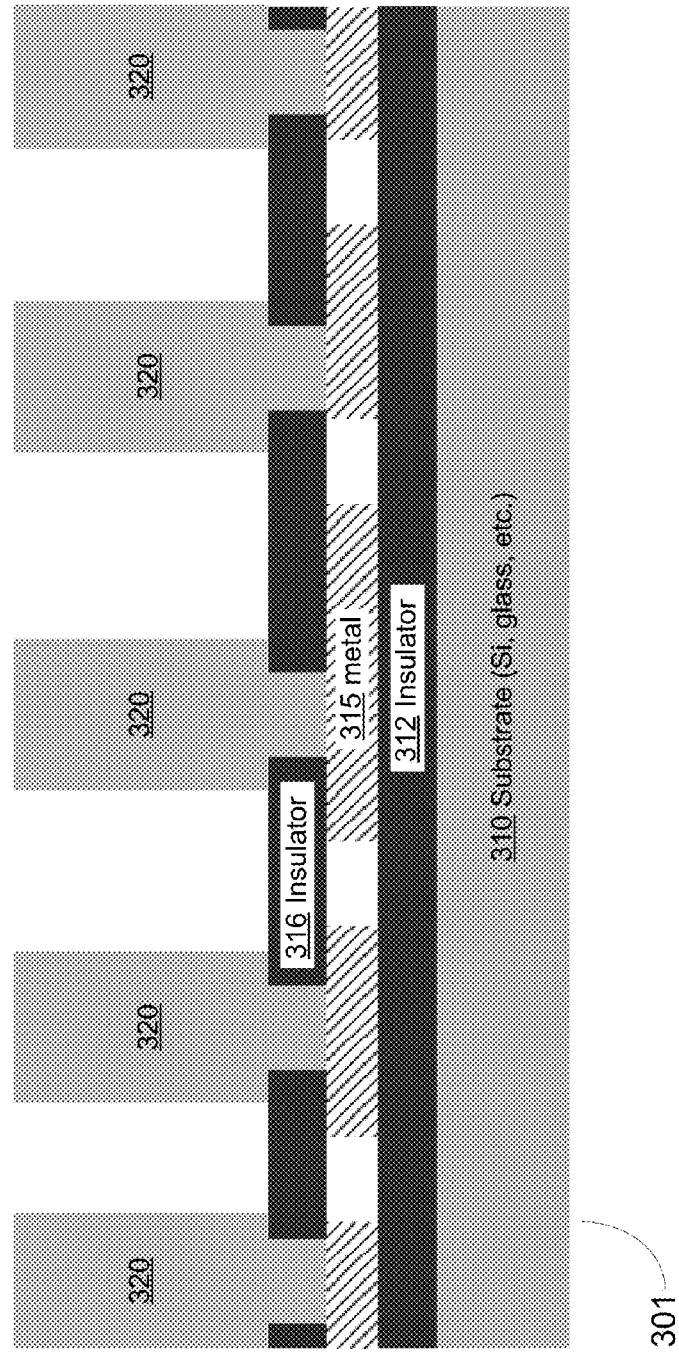

FIG. 3E illustrates formation of lower metal bonding pads 320, in accordance with embodiments of the present invention. The illustrated forming may be via any suitable process and materials. For example, a seed layer of about 100 nm of nickel (Ni) is deposited. It is appreciated that a mask is not required. Next, spin coating may be used to apply a negative tone mask of photoresist, e.g., of at least 10 µm in thickness. Photolithography is used to define the bonding pads. The lower metal bonding pads 320, comprising, for example, 8 µm of copper (Cu), 255 nm of nickel (Ni), 20 µm of tin (Sn) and 10 nm of gold (Au), may be electroplated. The seed layer may be subsequently etched off by dipping in nitric acid ($HNO_3$). Accordingly, a second sub-assembly 301 is formed.

Figure 3F:
FIGS. 3F, 3G and 3H illustrate an exemplary alternative process for forming a carrier wafer sub-assembly, in accordance with embodiments of the present invention.
Figure 3G:
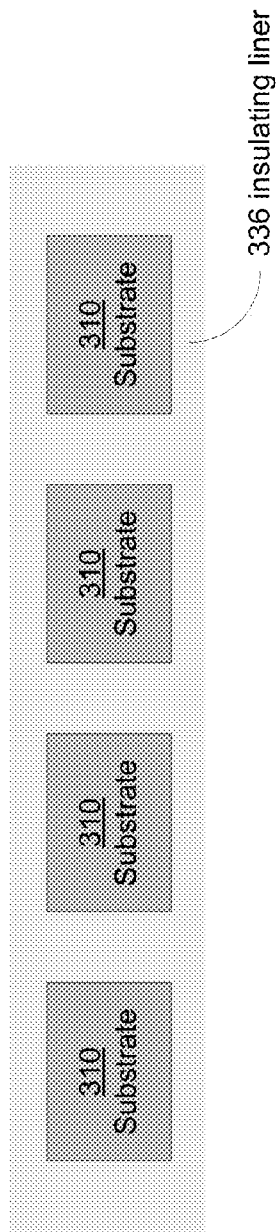
Figure 3H:
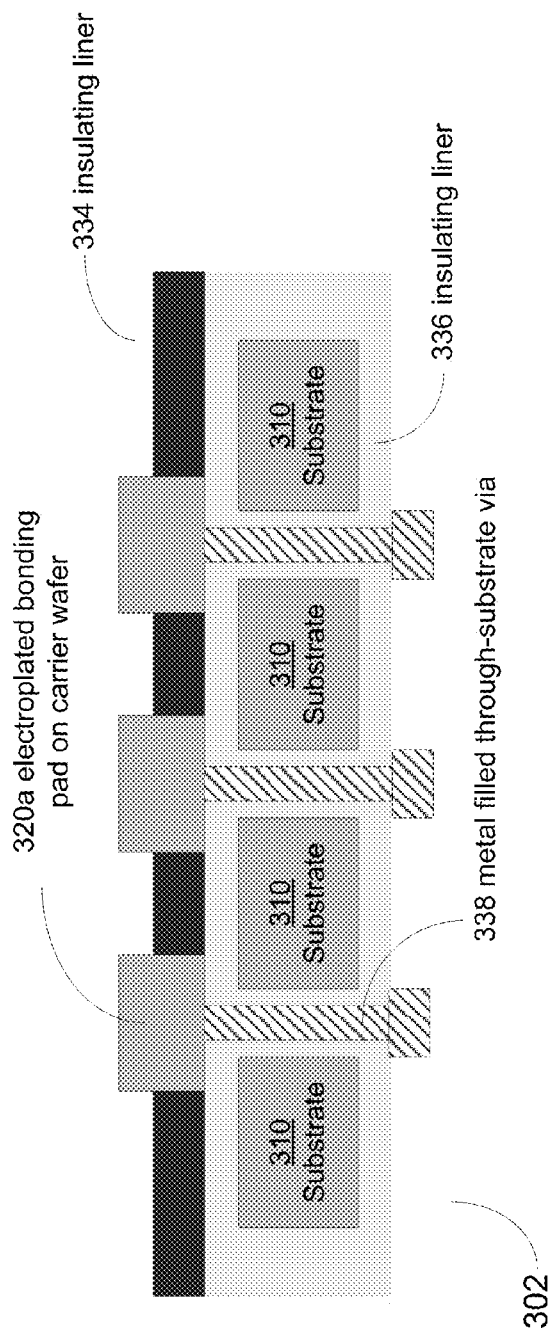

FIGS. 3F through 3H illustrate an exemplary alternative process 330 for forming a carrier wafer sub-assembly 302, in accordance with embodiments of the present invention. Exemplary processes for joining of the light emitting diode sub-assembly 201 with the carrier wafer sub-assembly 302 will be further described below.

In FIG. 3F, a substrate 310 is etched to form vias through the entire thickness of the substrate wafer. Any suitable process may be used, for example, deep reactive ion etching (RIE). Is appreciated that the illustrated via holes are depicted in cross section, and do not result in separate pieces of substrate. In FIG. 3G, the sidewall of the via holes is passivated with insulating layer 336. Any suitable materials and processes may be utilized, for example, the passivating material may be silicon dioxide (SiO2), deposited by either thermal growth, plasma-enhanced chemical vapor deposition (PECVD) or low-pressure chemical vapor deposition (LPCVD) processes.

FIG. 3H illustrates filling of the vias, in accordance with embodiments of the present invention. A metal seed layer, for example, Ti/Cu, Ta/Cu, W/Cu and/or TiW/Cu, is blanket deposited, followed by photolithography patterning to expose the through-substrate-vias. Then an electroplating process is applied to the wafer, in order to fill the through-substrate-vias 338 with Cu and Sn (after the full thickness is filled up with Cu). Then the seed layer out of the through-substrate-vias is removed by wet etching, forming wafer subassembly 302.

In accordance with embodiments of the present invention, the substrate wafer 310 can also be etched deeply, leaving a thin layer of substrate material remaining, and this thin layer can be finally polished off after other process operations are complete, e.g., after seed layer removal.

Figure 3I:
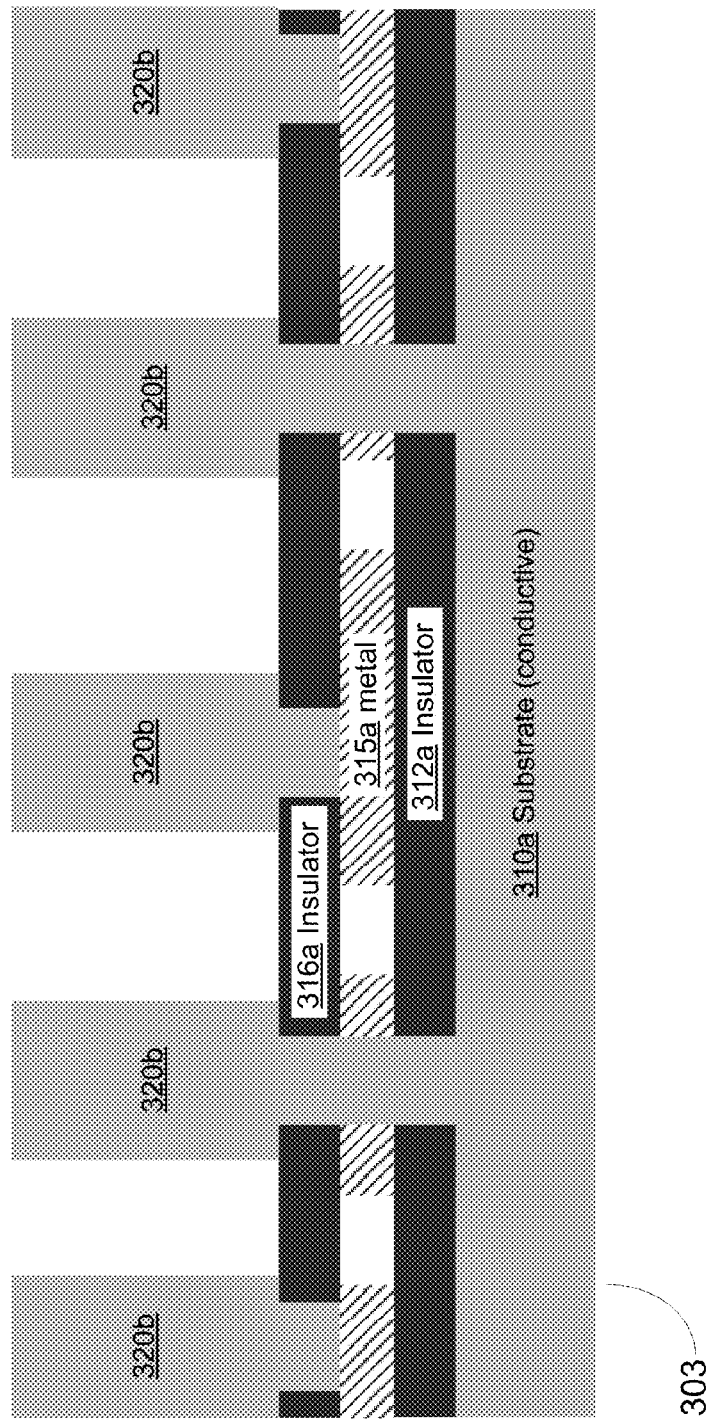
FIG. 3I illustrates an alternative embodiment of a carrier wafer subassembly, in accordance with embodiments of the present invention.

FIG. 3I illustrates an alternative embodiment 340 of a carrier wafer subassembly 303, in accordance with embodiments of the present invention. In FIG. 3I, insulator 312*a*, metal 315*a* and insulator 316*a* are modified from the forms 312, 315 and 316 (FIG. 3E) to allow some instances of filled vias 320*b* to make contact with a conductive substrate 310*a*. Conductive substrate 310*a* may comprise any suitable material, for example a metal or alloy, and may server multiple functions, including, for example, the functions of a mechanical substrate, one electrode of an LED assembly, and as a heat sink.

Figure 3J:
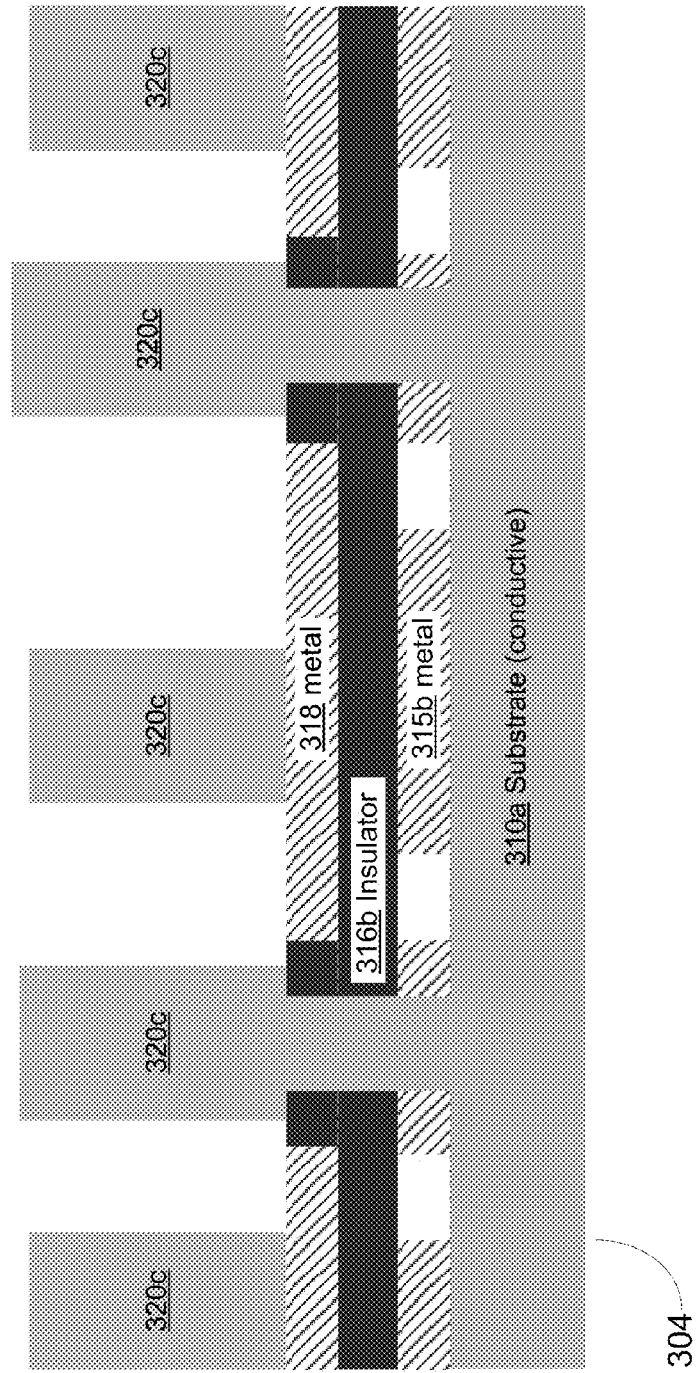
FIG. 3J illustrates an alternative embodiment of a carrier wafer subassembly, in accordance with the present invention.

FIG. 3J illustrates an alternative embodiment 350 of a carrier wafer subassembly 304, in accordance with the present invention. In contrast to wafer subassembly 301 (FIG. 3E), wafer subassembly lacks insulator 312 deposited on substrate 310*a*. Rather, patterned metal 315*b* is deposited directly onto substrate 310*a*, via any suitable process. An additional patterned metal 318 is deposited onto insulator 316*b*. Some filled metal vias 320*c* contact patterned metal 318 while some filled metal vias 320*c* contact patterned metal 315*b*.

FIGS. 4A through 4D illustrate an exemplary process 400 for joining light emitting diode sub-assembly 201 to carrier wafer sub-assembly 301 (or 302, 303, 304), in accordance with embodiments of the present invention.

Figure 4A:
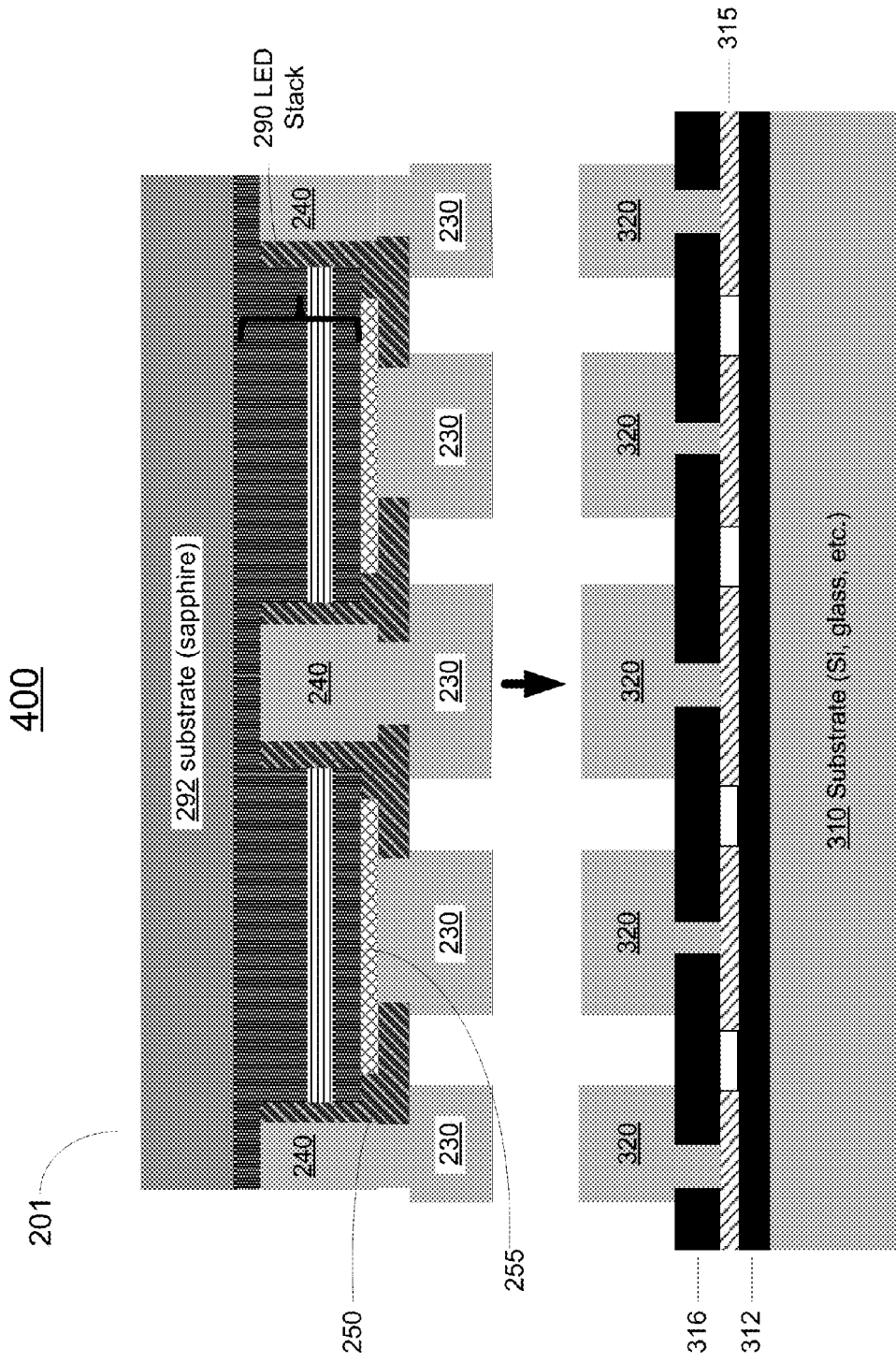
FIGS. 4A, 4B, 4C and 4D illustrate an exemplary process for joining a light emitting diode sub-assembly to a carrier wafer sub-assembly, in accordance with embodiments of the present invention.

FIG. 4A illustrates the joining of sub-assembly 201 with sub-assembly 301, in accordance with embodiments of the present invention. The light emitting diode sub-assembly 201 is inverted. The joining may be via any suitable process and materials. For example, a thermo compression wafer bonding process may be utilized. In accordance with embodiments of the present invention, the back side of substrate 292 may be polished on the back side, e.g., the top as illustrated in FIG. 4A, which may improve transparency and aid alignment of the two sub-assemblies 201, 301, from the back side of substrate 292.

Figure 4B:
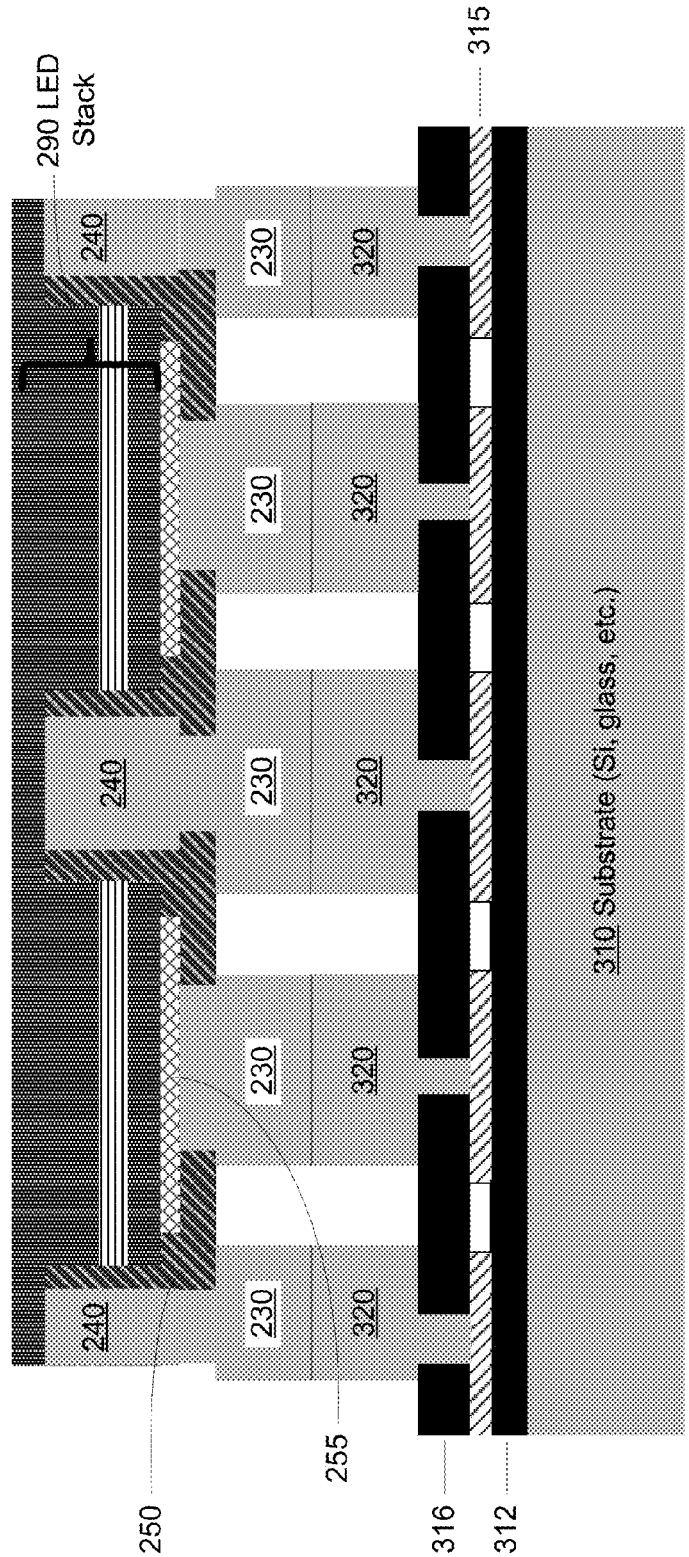

As illustrated in FIG. 4B, the substrate 292 of sub-assembly 201 is removed, in accordance with embodiments of the present invention. The removal may be via any suitable process and materials. For example, the substrate 292 may be removed by a laser lift off process, or may be polished off, e.g., via chemical mechanical polishing, or lapping.

Figure 4C:
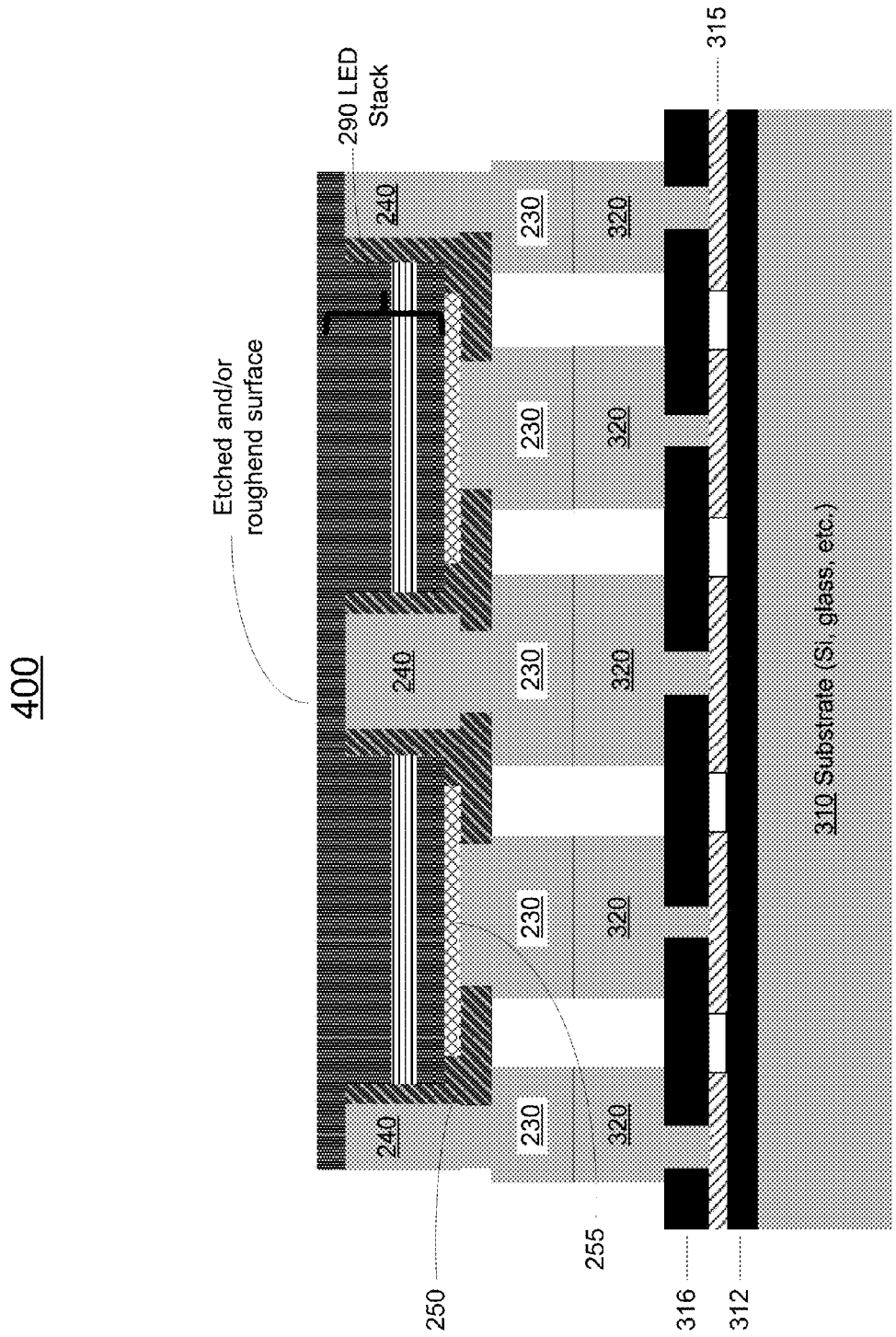

FIG. 4C illustrates etching of the top, in the view of FIG. 4C, surface of the light emitting diode, e.g., layer 294 (FIG. 2A). The etching may be via any suitable process and materials, and may remove, for example, about 1.65 µm of material. In addition, the top surface of the light emitting diode, e.g., layer 294 (FIG. 2A), may be roughened, in accordance with embodiments of the present invention. The roughening may enhance light output, and may be accomplished via any suitable process.

Figure 4D:
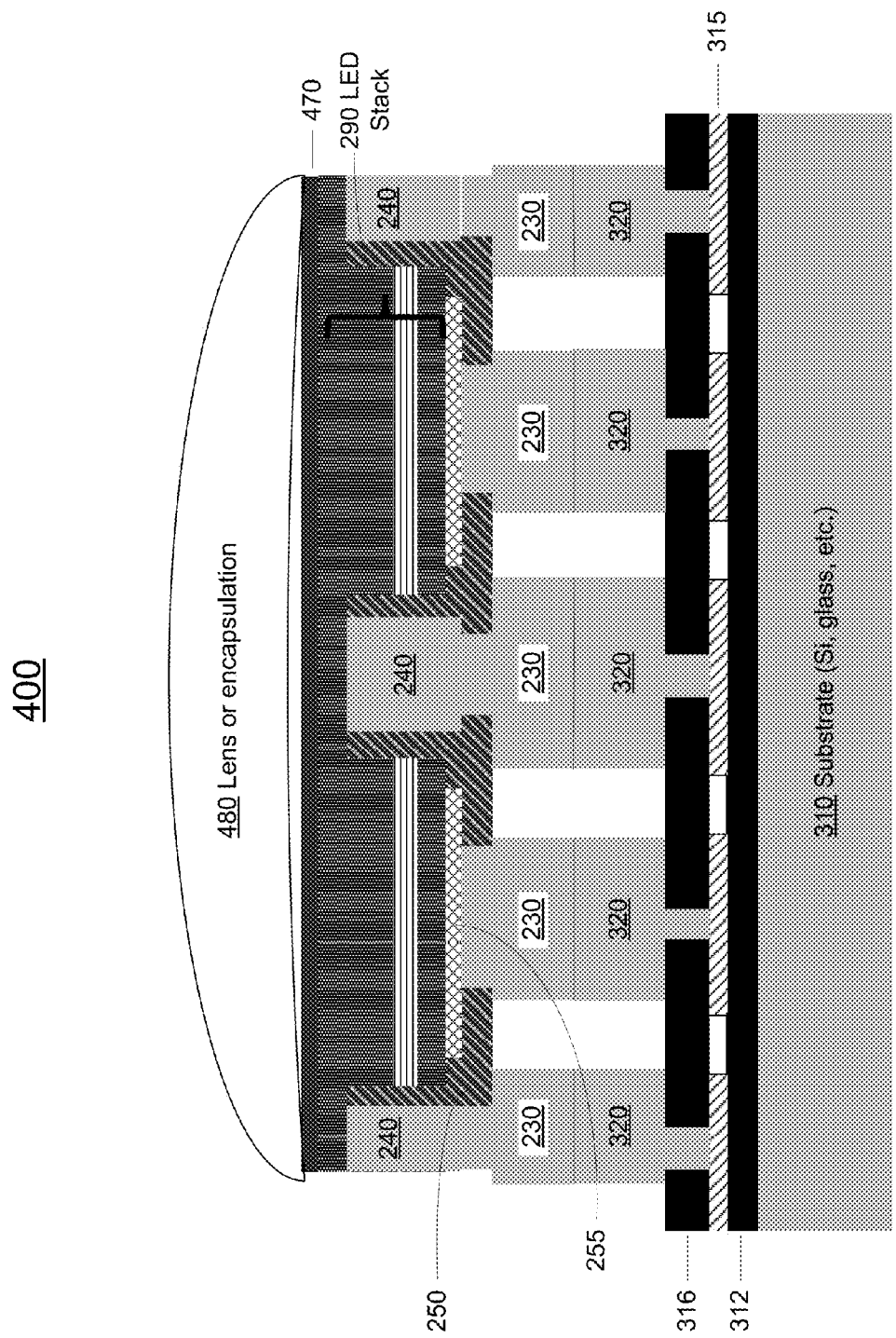

FIG. 4D illustrates a deposition of optional layer 470 of transparent conductive material, e.g., indium tin oxide (ITO). The deposition may be via any suitable process and materials. For example, 250 nm of ITO may be sputtered and then annealed in a nitrogen ($N_2$) atmosphere for about four hours at about 180° C. A shadow mask is generally needed before depositing the ITO 470. The mask may be the same as or similar to a mask utilized in defining an array area, as illustrated in FIG. 2A.

FIG. 4D further illustrates the formation of a layer 480 forming a lens or encapsulant. Layer 480 may be transparent, and may be designed to optically enhance light emission and/or directionality, of a light emitting diode. Layer 480 may also comprise a phosphor layer, e.g., for producing light responsive to receiving light energy from a light emitting diode.

It is appreciated that the processes described above may take place at a wafer level. For example, substrate 292 (FIG. 2A) may comprise a "2-inch" sapphire wafer. Accordingly, the resulting light emitting diode with vias may have on the order of three square inches of light emitting diode surface. The structures disclosed herein may advantageously provide sufficient thermal conduction to extract heat from such a large device.

In addition, in accordance with embodiments of the present invention, the wafer may be singulated, e.g., cut between vias and contact structures, into smaller-area light emitting diodes.

In accordance with embodiments of the present invention, the high efficiency light emitting diode with vias may be coupled to a heat sink, e.g., on the bottom of substrate 310.

Figure 5:
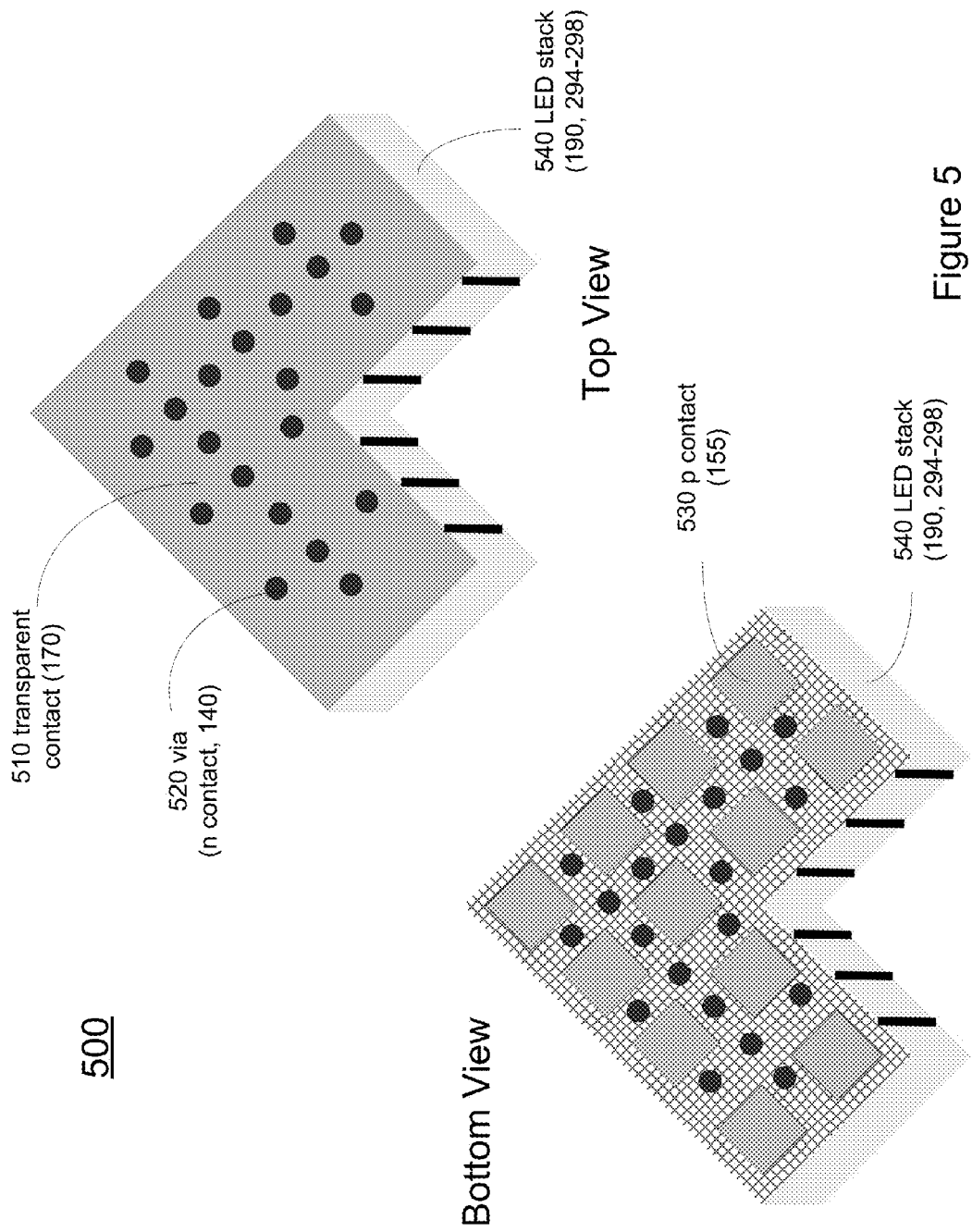
FIG. 5 illustrates a perspective sectional view of a high efficiency light emitting diode (LED) with vias, in accordance with embodiments of the present invention.

FIG. 5 illustrates a perspective sectional view of a high efficiency light emitting diode (LED) with vias 500, in accordance with embodiments of the present invention. Light emitting diode 500 may generally correspond to light emitting diode 100 of FIG. 1A. Light emitting diode 500 comprises a stack of light emitting materials 540. Materials stack 540 may generally correspond to LED stack 190 (FIG. 1A), e.g., layers 294-298 of FIG. 2A.

With reference to the top view in FIG. 5, light emitting diode 500 comprises a transparent contact 510 on its top. Transparent contact 510 may generally correspond to transparent layer 170 of FIG. 1A. Light emitting diode 500 comprises a plurality of filled vias 520. Filled vias 520 may conduct electricity to the n-type material of the light emitting diode 540. Filled vias 520 generally correspond to filled vias 140 of FIG. 1A. The vias 520 should represent less than 10% of the top surface area of light emitting diode 500. The vias 520 should be spaced no more than about 200 μm apart.

With reference to the bottom view in FIG. 5, light emitting diode 500 comprises a plurality of contacts 530. Contacts 530 may conduct electricity to the p-type material of the light emitting diode 540. Contacts 530 may generally correspond to contacts 155 of FIG. 1A.

Figure 6:
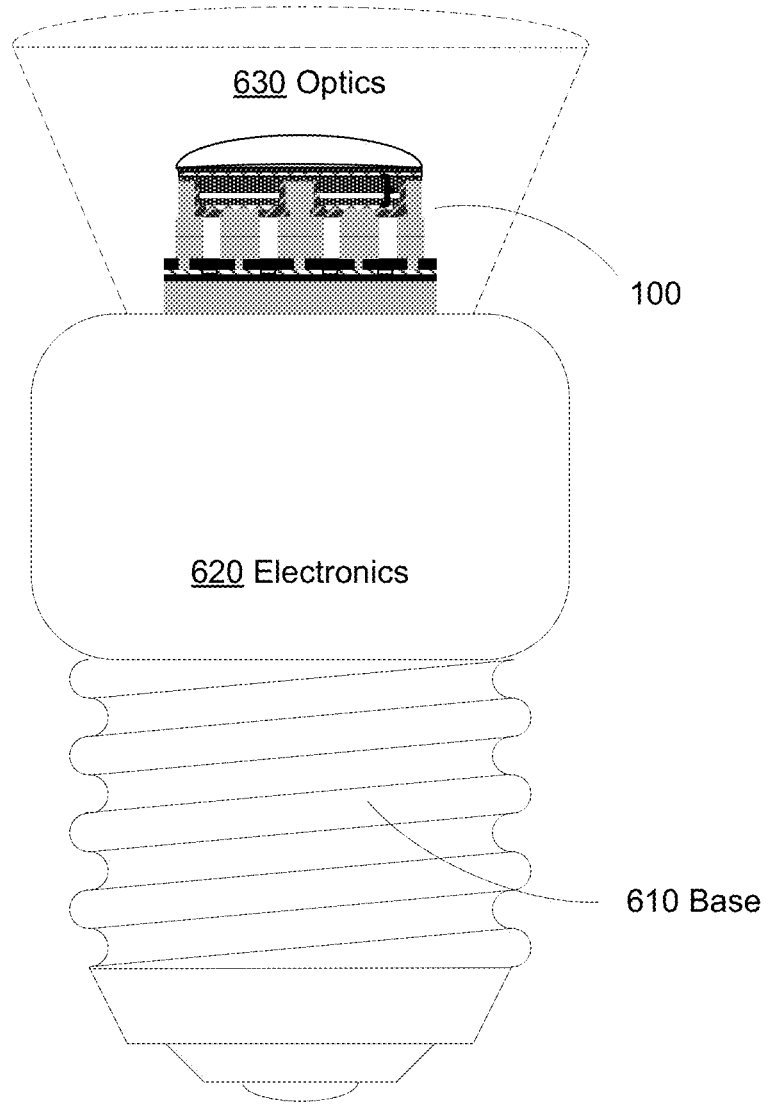
FIG. 6 illustrates an example of an application of a high efficiency light emitting diode with vias, in accordance with embodiments of the present invention.

FIG. 6 illustrates an example of an application of a high efficiency light emitting diode with vias, e.g., a high efficiency light emitting diode with vias 100, in accordance with embodiments of the present invention. Light appliance 600 is well suited to a variety of lighting applications, including domestic, industrial and landscape lighting. Light appliance 600 is also well suited to stage or theatrical lighting. Light appliance 600 comprises a base 610. As illustrated, base 610 is an Edison type base. It is appreciated that embodiments in accordance with the present invention are well suited to other types of bases, including, for example, GU, bayonet, bipin, wedge, stage pin or other types of bases.

Light appliance 600 additionally comprises a body portion 620 that houses power conditioning electronics (not shown) that convert 110 V AC input electrical power (or 220 V AC, or other selected input electrical power) to electrical power suitable for driving a plurality of light emitting diode devices 640. Body portion 620 may also comprise, or couple to, optional heat sink features (not shown).

Light appliance 600 may additionally comprise optional optics 630. Optics 630 comprise diffusers and/or lenses for focusing and/or diffusing light from the plurality of light emitting diode devices 640 into a desired pattern.

Light appliance 600 comprises a plurality of high efficiency light emitting diode with vias devices. Individual instances of plurality of high efficiency light emitting diode with vias devices may correspond to assemblies previously described herein. For example light appliance 600 may include one or more instances of a high efficiency light emitting diode with vias 100. Each instance of a high efficiency light emitting diode with vias 100 may comprise one or more light emitting diodes. It is appreciated that not all high efficiency light emitting diode with vias 100 need be identical, and that not all light emitting diodes in a single instance of high efficiency light emitting diode with vias 100 need be identical.

It is to be further appreciated that appliance 600 may comprise a plurality of individual, different, LED devices. For example, one instance of an electronic device may be a blue light emitting diode comprising a sapphire substrate. Another instance of an electronic device may be a green light emitting diode comprising a gallium phosphide (GaP) substrate. Another instance of an electronic device may be a red light emitting diode comprising a gallium arsenide (GaAs) substrate. The three instances of electronic devices may be arranged such that the light from such three colors may be combined to produce a variety of spectral colors. For example, a plurality of light emitting diode devices may operate in combination to produce a "white" light output.

In accordance with embodiments of the present invention, device 600 may include additional electronics associated with the LED devices. In one exemplary embodiment, such additional electronics may comprise circuits to implement a white balance among tri-color LEDs.

Embodiments in accordance with the present invention provide systems and methods for high performance light emitting diodes with vias. In addition, embodiments in accordance with the present invention provide systems and methods for high performance light emitting diodes with vias that enable wafer level packaging, improved thermal conduction and electrical field distribution, and further enable electrical contacts on opposite sides. Further, embodiments in accordance with the present invention provide systems and methods for high performance light emitting diodes with vias that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. An article of manufacture comprising:
   a light emitting diode comprising a plurality of filled vias configured to connect a doped region on one side of said diode to a plurality of contacts on the other side of said diode.

2. The article of manufacture of claim 1 wherein said vias comprise less than 10% of a surface area of said light emitting diode.

3. The article of manufacture of claim 1 wherein a distance between any two vias in less than 200 μm.

4. The article of manufacture of claim 1 further comprising a transparent conductor on said one side of said diode, and wherein said plurality of filled vias are electrically coupled to said transparent conductor.

5. The article of manufacture of claim 1 further comprising a plurality of conductive traces on said one side of said diode, and wherein said plurality of filled vias are electrically coupled to said conductive traces.

6. The article of manufacture of claim 1 further comprising:
a phosphor layer and an optical element bonded to said one side of said diode.

7. The article of manufacture of claim 1 further comprising:
a carrier wafer bonded to said plurality of filled vias.

8. The article of manufacture of claim 7 wherein said carrier wafer comprises at least one material of the set of silicon, ceramic, glass, tungsten, molybdenum, invar, aluminum, nickel, steel, brass and copper.

9. The article of manufacture of claim 7 wherein said carrier wafer comprises a printed circuit board laminate.

10. The article of manufacture of claim 7 wherein said carrier wafer is characterized as having a thermal conductivity greater than 10 W/mK.

11. The article of manufacture of claim 7 wherein said carrier wafer is further coupled to a heat sink device.

12. The article of manufacture of claim 5 wherein said conductive traces are placed laterally on top of the surface of said carrier wafer and are configured to make electrical contact with external circuitry.

13. The article of manufacture of claim 5 wherein said conductive traces are placed laterally on top of the surface of said carrier wafer and are configured to make electrical contact with external circuitry, while a second electrode is configured to make electrical contact with external circuitry through the thickness of said carrier wafer.

14. The article of manufacture of claim 7 wherein both electrodes or said light emitting diode connect to external circuitry through the thickness of said carrier wafer.

15. The article of manufacture of claim 1 wherein a substrate utilized for growing said light emitting diode is absent.

16. The article of manufacture of claim 1 further comprising
electronics to convert a source of alternating current to direct current for use by said light emitting diode; and
a base to couple said electronics to said source of alternating current.

17. A light emitting diode apparatus comprising:
an n-doped semiconductor region;
a multiple quantum well (MQW) region disposed on said n-doped semiconductor region;
a p-doped semiconductor region disposed on said MQW region;
a plurality of filled vias through said p-doped semiconductor region and through said MQW region, contacting said n-doped semiconductor region, and
wherein both terminals of said light emitting diode apparatus are on the same side of said light emitting diode apparatus as said p-doped semiconductor region.

18. The light emitting diode apparatus of claim 17 wherein a surface of said n-doped semiconductor region away from said MQW region is free of electrical contacts.

19. An apparatus comprising:
a light emitting diode comprising:
an n-doped semiconductor region;
a multiple quantum well (MQW) region disposed on said n-doped semiconductor region;
a p-doped semiconductor region disposed on said MQW region;
a plurality of filled vias through said p-doped semiconductor region and through said MQW region, contacting said n-doped semiconductor region;
a carrier substrate;
a conductive pattern supported by said carrier substrate; and
metal for electrically coupling said plurality of filled vias to said conductive pattern.

20. The apparatus of claim 19 wherein said carrier substrate is configured to couple thermal energy away from said light emitting diode.

* * * * *